United States Patent
Kitai et al.

(10) Patent No.: US 11,401,393 B2
(45) Date of Patent: Aug. 2, 2022

(54) PREPREG, METAL-CLAD LAMINATE, AND WIRING BOARD

(71) Applicant: PANASONIC INTELLECTUAL PROPERTY MANAGEMENT CO., LTD., Osaka (JP)

(72) Inventors: Yuki Kitai, Osaka (JP); Mikio Sato, Osaka (JP); Yasunori Hoshino, Osaka (JP); Masashi Koda, Osaka (JP); Takayoshi Ozeki, Osaka (JP); Hiroaki Fujiwara, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 257 days.

(21) Appl. No.: 16/649,920

(22) PCT Filed: Sep. 28, 2018

(86) PCT No.: PCT/JP2018/036185
§ 371 (c)(1),
(2) Date: Mar. 23, 2020

(87) PCT Pub. No.: WO2019/065940
PCT Pub. Date: Apr. 4, 2019

(65) Prior Publication Data
US 2020/0270411 A1 Aug. 27, 2020

(30) Foreign Application Priority Data
Sep. 29, 2017 (JP) .............................. JP2017-190781

(51) Int. Cl.
| C08J 5/24 | (2006.01) |
| B32B 15/08 | (2006.01) |
| C08G 65/48 | (2006.01) |
| C08J 3/24 | (2006.01) |
| H05K 1/03 | (2006.01) |

(52) U.S. Cl.
CPC ................ C08J 5/24 (2013.01); B32B 15/08 (2013.01); C08G 65/485 (2013.01); C08J 3/24 (2013.01); H05K 1/0366 (2013.01); B32B 2457/08 (2013.01); C08J 2371/12 (2013.01); H05K 2201/0158 (2013.01)

(58) Field of Classification Search
CPC . C08J 5/24; C08J 3/24; C08J 2371/12; C08G 65/485; H05K 2201/0158; H05K 1/0366; B32B 2457/08; B32B 15/08
USPC ...................................................... 428/411.1
See application file for complete search history.

(56) References Cited

U.S. PATENT DOCUMENTS

| 8,227,361 B2 * | 7/2012 | Amou ........................ C08J 5/24 442/180 |
| 2004/0146692 A1 | 7/2004 | Inoue et al. |
| 2005/0064159 A1 | 3/2005 | Amou et al. |
| 2007/0292668 A1 | 12/2007 | Amou et al. |
| 2008/0254257 A1 | 10/2008 | Inoue et al. |
| 2009/0266591 A1 | 10/2009 | Amou et al. |
| 2015/0218326 A1 * | 8/2015 | Kitai ....................... B32B 5/022 428/209 |
| 2016/0007452 A1 | 1/2016 | Yan et al. |
| 2016/0168378 A1 | 6/2016 | Umehara et al. |

FOREIGN PATENT DOCUMENTS

| CN | 103755989 A | 4/2014 |
| JP | 2005-089691 | 4/2005 |
| JP | 2006-516297 | 6/2006 |
| JP | 2009-263569 | 11/2009 |
| JP | 2016-113543 | 6/2016 |

OTHER PUBLICATIONS

Wallenberger et al., Fiberglass and Glass Technology, Springer US, 2010. (Year: 2010).*
ISR issued in WIPO Patent Application No. PCT/2018/036185, dated Jan. 8, 2019, English translation.
Editors: Wallenberger, Frederick T., Bingham, Paul A. Title: Fiberglass and Glass Technology Page(s) Being Submitted: 5 Specific Page Number of Relevance: p. 186 Year of Publication: 2010 Publisher: Springer US Hardcover ISBN: 978-1-4419-0735-6.†

\* cited by examiner
† cited by third party

*Primary Examiner* — Hui H Chin
(74) *Attorney, Agent, or Firm* — Greenblum & Bernstein, P.L.C.

(57) ABSTRACT

A prepreg includes a resin composition or a semi-cured product of the resin composition, and a glass cloth, wherein the resin composition contains a modified polyphenylene ether compound terminally modified with a substituent having an unsaturated carbon-carbon double bond, and a crosslinkable curing agent having an unsaturated carbon-carbon double bond in a molecule, a content of the modified polyphenylene ether compound is 40 to 90 mass % with respect to a total mass of the modified polyphenylene ether compound and the crosslinkable curing agent, a cured product of the resin composition has a relative permittivity of 2.6 to 3.8, the glass cloth has a relative permittivity of 4.7 or less and a dielectric loss tangent of 0.0033 or less, and a cured product of the prepreg has a relative permittivity of 2.7 to 3.8 and a dielectric loss tangent of 0.002 or less.

7 Claims, 4 Drawing Sheets

PREPREG, METAL-CLAD LAMINATE, AND WIRING BOARD

TECHNICAL FIELD

The present invention relates to a prepreg, a metal-clad laminate, and a wiring board.

BACKGROUND ART

In various electronic devices, with an increase in the information processing amount, mounting technologies such as higher integration of semiconductor devices to be mounted, higher wiring density, and multilayering are rapidly progressing. Moreover, as a wiring board used for various electronic devices, it is required to be a wiring board corresponding to high frequency, such as a millimeter wave radar substrate in on-vehicle use, for example. Substrate materials for constituting a base material of wiring boards used in various electronic devices are required to have low permittivity and dielectric loss tangent in order to increase signal transmission speed and reduce loss in signal transmission.

It is known that polyphenylene ethers have excellent low dielectric properties such as permittivity and dielectric loss tangent, and have excellent low dielectric properties such as permittivity and dielectric loss tangent even in high frequency bands from MHz band to GHz band (high frequency regions). Therefore, polyphenylene ethers are considered to be used as, for example, a molding material for high frequency applications. More specifically, it is preferably used as a substrate material for constituting a base material of a wiring board provided in an electronic device using a high frequency band or the like.

On the other hand, when used as a molding material such as a substrate material, it is required not only to have excellent low dielectric properties but also to have excellent heat resistance and the like. Base on this, it is considered that polyphenylene ether is modified to improve heat resistance. Examples of such a substrate material include a prepreg and a laminate including a resin composition containing a modified a polyphenylene ether, and the like. Patent Literature 1 describes a polyphenylene ether having a polyphenylene ether moiety in the molecular structure, and having an ethenylbenzyl group or the like at the molecular terminal, and having a number average molecular weight of 1000 to 7000, and a prepreg and a laminate including the polyphenylene ether resin composition containing a crosslinkable curing agent.

According to Patent Literature 1, it is disclosed that a laminate having high heat resistance, moldability and the like can be obtained without degrading dielectric properties. As described above, it is considered that when a material with reduced permittivity and dielectric loss tangent is used as a substrate material for producing an insulating layer provided in the wiring board, loss in signal transmission in the obtained wiring board can be reduced.

On the other hand, it is known that distortion called skew which degrades signal quality is generated, in a wiring board obtained by using a prepreg including glass cloth. It is known that signal quality degradation due to skew becomes more remarkable, particularly in a wiring board provided in an electronic device using high frequency bands. It is considered due to a difference occurred in permittivity between a portion where a yarn constituting the glass cloth is present and a portion where the yarn is not present, in a metal-clad laminate and a wiring board obtained using a prepreg including glass cloth.

CITATION LIST

Patent Literature

Patent Literature 1: JP 2006-516297 A

SUMMARY OF INVENTION

The present invention has been made in view of the above circumstances, and an object of the present invention is to provide a prepreg and a metal-clad laminate that can suitably produce a wiring board excellent in heat resistance, in which loss in signal transmission and signal quality degradation due to skew are sufficiently suppressed. In addition, it is an object of the present invention to provide a wiring board excellent in heat resistance, in which loss in signal transmission and signal quality degradation due to skew are sufficiently suppressed.

One aspect of the present invention is a prepreg including a resin composition or a semi-cured product of the resin composition, and a glass cloth, in which the resin composition contains a modified polyphenylene ether compound terminally modified with a substituent having an unsaturated carbon-carbon double bond, and a crosslinkable curing agent having an unsaturated carbon-carbon double bond in a molecule, a content of the modified polyphenylene ether compound is from 40% by mass to 90% by mass with respect to a total mass of the modified polyphenylene ether compound and the crosslinkable curing agent, a cured product of the resin composition has a relative permittivity of 2.6 to 3.8, the glass cloth has a relative permittivity of 4.7 or less and a dielectric loss tangent of 0.0033 or less, and a cured product of the prepreg has a relative permittivity of 2.7 to 3.8 and a dielectric loss tangent of 0.002 or less.

These and other objects, features and advantages of the present invention will be apparent from the following detailed description.

DESCRIPTION OF EMBODIMENTS

The occurrence of skew is considered due to a difference occurred in permittivity between a portion where glass cloth is present and a portion where glass cloth is not present in the metal-clad laminate and wiring board obtained using the prepreg including the glass cloth, and the present inventors have focused on this consideration. Then, the present inventors have focused on the fact that a fibrous base material itself constituting the prepreg had not been studied much while, conventionally, how to knit glass cloth, such as opening yarns in glass cloth to reduce coarseness and minuteness, in order to suppress signal quality degradation due to skew derived from the glass cloth, had been studied, and non-use of glass cloth had been studied. The present inventors have studied the materials of the fibrous base material. When a glass cloth having a relatively high permittivity is used as the fibrous base material, a resin composition in which permittivity of a cured product thereof is low is used as a resin composition constituting the prepreg, in order to reduce the permittivity of the cured product of the prepreg. Based on this, it has been found that a difference occurs in permittivity between the portion where a yarn constituting the glass cloth is present and the portion where the yarn is not present, and it is difficult to suppress the signal quality degradation due to skew. Therefore, the present inventors have focused on the fact that a quartz glass cloth having a relatively high content of $SiO_2$ and the like have a relatively low permittivity, and a glass cloth having a relatively low permittivity such as this quartz glass cloth is used as the fibrous base material, and as a result of detailed studies of the resin composition and the structure of the prepreg corresponding to the glass cloth, and the like, it has been found that the above object can be achieved by the following present invention.

Hereinafter, the embodiment according to the present invention will be described, but the present invention is not limited thereto.

<Prepreg>

Figure 1:
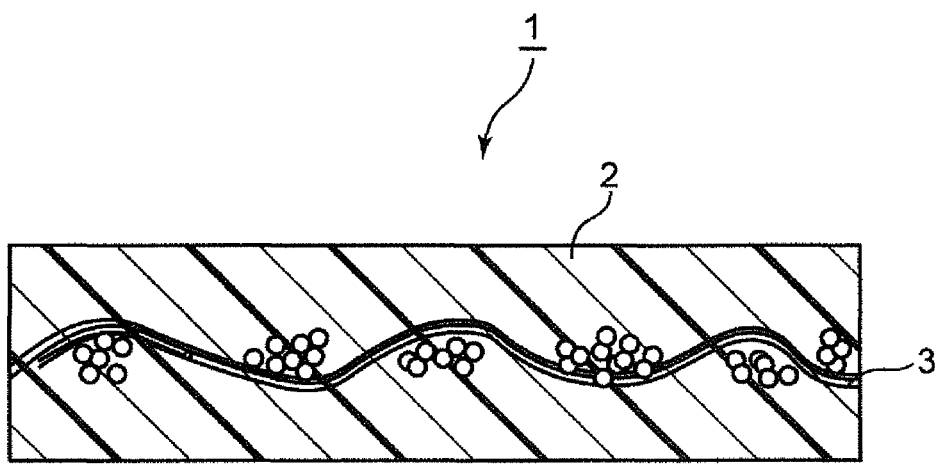
FIG. 1 is a schematic cross-sectional view showing an example of a prepreg according to an embodiment of the present invention.

The prepreg according to one embodiment of the present invention includes a resin composition or a semi-cured product of the resin composition, and a fibrous base material. As shown in FIG. 1, examples of prepreg 1 include those including a resin composition or semi-cured product 2 of the resin composition, and fibrous base material 3 present in the resin composition or semi-cured product 2 of the resin composition, and the like.

In the present embodiment, the semi-cured product is a product that has been cured halfway to such an extent that the resin composition can be further cured. That is, the semi-cured product is a semi-cured (B-staged) resin composition. For example, when the resin composition is heated, first, viscosity gradually decreases with melting, then curing starts, and viscosity gradually increases. In such a case, the semi-curing includes a state from a start of gradual viscosity decrease to complete curing, and the like.

The prepreg according to the present embodiment may include a semi-cured product of the resin composition as described above, or may include the uncured resin composition itself. That is, the prepreg according to the present embodiment may be a prepreg including the semi-cured product of the resin composition (the B-stage resin composition) and a fibrous base material, or may be a prepreg including the resin composition before curing (the A-stage resin composition) and a fibrous base material.

The resin composition in the prepreg according to the present embodiment contains a modified polyphenylene ether compound terminally modified with a substituent having an unsaturated carbon-carbon double bond, and a crosslinkable curing agent having an unsaturated carbon-carbon double bond in a molecule, and a content of the modified polyphenylene ether compound is from 40% by mass to 90% by mass with respect to a total mass of the modified polyphenylene ether compound and the crosslinkable curing agent. Also, a cured product of the resin composition has a relative permittivity of 2.6 to 3.8. Moreover, the fibrous base material in the prepreg is a glass cloth having a relative permittivity of 4.7 or less and a dielectric loss tangent of 0.0033 or less. A cured product of the prepreg has a relative permittivity of 2.7 to 3.8 and a dielectric loss tangent of 0.002 or less.

The prepreg as described above is a prepreg that can suitably produce a wiring board excellent in heat resistance, in which loss in signal transmission and signal quality degradation due to skew are sufficiently suppressed. First, it is considered that a prepreg obtained by using the glass cloth having a relatively low relative permittivity as described above as the fibrous base material constituting the prepreg has excellent low dielectric properties of a cured product thereof. However, only by simply using the glass cloth having a relatively low relative permittivity as described above as the fibrous base material, there have been cases where low dielectric properties of the cured product are not sufficiently high, or heat resistance of the cured product is not sufficiently high. Therefore, the prepreg not only uses the glass cloth having a relatively low relative permittivity as described above as the fibrous base material, but also uses a resin composition containing the modified polyphenylene ether compound and the crosslinkable curing agent in a predetermined ratio, as the resin composition constituting the prepreg. Further, in the prepreg, a composition of the resin composition, a state of glass cloth and the like are adjusted so that the relative permittivity of the cured product of the resin composition, and the relative permittivity and dielectric loss tangent of the cured product of the prepreg are within the above ranges. Thus, it is possible to obtain a prepreg that can suitably produce a wiring board excellent in heat resistance, in which loss in signal transmission and signal quality degradation due to skew are sufficiently suppressed.

[Resin Composition]

The resin composition used in the present embodiment contains the modified polyphenylene ether compound and the crosslinkable curing agent.

(Modified Polyphenylene Ether Compound)

The modified polyphenylene ether compound is not particularly limited as long as it is a modified polyphenylene ether compound terminally modified with a substituent having an unsaturated carbon-carbon double bond. Examples of the modified polyphenylene ether compound include a modified polyphenylene ether compound having a polyphenylene ether chain in a molecule and terminally modified with a substituent having an unsaturated carbon-carbon double bond, and the like.

Specific examples of the modified polyphenylene ether compound include modified polyphenylene ether compounds represented by the following formula (1) or formula (2), and the like.

[Chemical Formula 1]

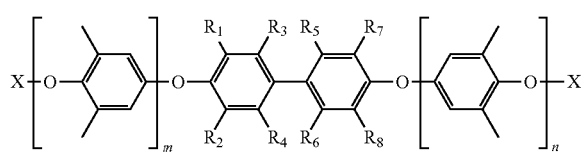

In the formula (1), m and n are preferably such that the total value of m and n is, for example, 1 to 30. Moreover, m is preferably 0 to 20, and n is preferably 0 to 20. That is, it is preferred that m represents 0 to 20, n represents 0 to 20, and the sum of m and n represents 1 to 30. In addition, Xs represent substituents having an unsaturated carbon-carbon double bond. Also, $R_1$ to $R_8$ are independent of each other.

[Chemical Formula 2]

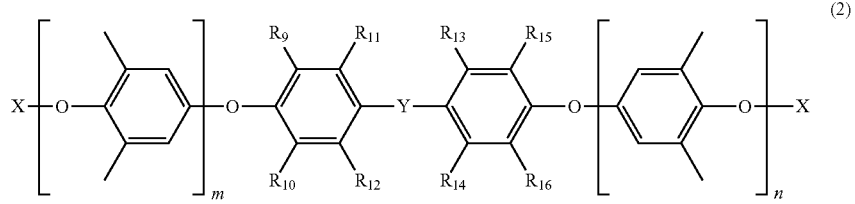

That is, $R_1$ to $R_8$ may be the same group or different groups. Further, $R_1$ to $R_8$ represent a hydrogen atom, an alkyl group, an alkenyl group, an alkynyl group, a formyl group, an alkylcarbonyl group, an alkenylcarbonyl group, or an alkynylcarbonyl group. Among them, $R_1$ to $R_8$ are preferably a hydrogen atom or an alkyl group.

Examples of the modified polyphenylene ether compounds represented by the formula (1) include a modified polyphenylene ether compound in which, among $R_1$ to $R_8$, $R_1$, $R_2$, $R_7$ and $R_8$ are methyl groups and the others are hydrogen atoms, a modified polyphenylene ether compound in which, among $R_1$ to $R_8$, $R_1$, $R_2$, $R_3$, $R_6$, $R_7$ and $R_8$ are methyl groups, and the others are hydrogen atoms, and the like.

Specific examples of the groups listed in $R_1$ to $R_8$ include the following.

The alkyl group is not particularly limited, but is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

The alkenyl group is not particularly limited, but is, for example, preferably an alkenyl group having 2 to 18 carbons, and more preferably an alkenyl group having 2 to 10 carbons. Specific examples thereof include a vinyl group, an allyl group, a 3-butenyl group, and the like.

The alkynyl group is not particularly limited, but is, for example, preferably an alkynyl group having 2 to 18 carbons, and more preferably an alkynyl group having 2 to 10 carbons. Specific examples thereof include an ethynyl group, a prop-2-yn-1-yl group (propargyl group), and the like.

The alkylcarbonyl group is not particularly limited as long as it is a carbonyl group substituted with an alkyl group, but is, for example, preferably an alkylcarbonyl group having 2 to 18 carbons, and more preferably an alkylcarbonyl group having 2 to 10 carbons. Specific examples thereof include an acetyl group, a propionyl group, a butyryl group, an isobutyryl group, a pivaloyl group, a hexanoyl group, an octanoyl group, a cyclohexylcarbonyl group, and the like.

The alkenylcarbonyl group is not particularly limited as long as it is a carbonyl group substituted with an alkenyl group, but is, for example, preferably an alkenylcarbonyl group having 3 to 18 carbons, and more preferably an alkenylcarbonyl group having 3 to 10 carbons. Specific examples thereof include an acryloyl group, a methacryloyl group, a crotonoyl group, and the like.

The alkynylcarbonyl group is not particularly limited as long as it is a carbonyl group substituted with an alkynyl group, but is, for example, preferably an alkynylcarbonyl group having 3 to 18 carbons, and more preferably an alkynylcarbonyl group having 3 to 10 carbons. Specific examples thereof include a propioloyl group and the like.

In the formula (2), m and n are the same as m and n in the formula (1). Also, in the formula (2), $R_9$ to $R_{16}$ are the same as $R_1$ to $R_8$ in the formula (1). In addition, Xs are the same as Xs in the formula (1). Further, Y represents a linear, branched, or cyclic hydrocarbon group. Furthermore, Y represents, for example, a group represented by the following formula (3).

Examples of the modified polyphenylene ether compounds represented by the formula (2) include a modified polyphenylene ether compound in which, among $R_9$ to $R_{16}$, $R_9$, $R_{10}$, $R_{15}$ and $R_{16}$ are methyl groups and the others are hydrogen atoms, a modified polyphenylene ether compound in which, among $R_9$ to $R_{16}$, $R_9$, $R_{10}$, $R_{11}$, $R_{14}$, $R_{15}$ and $R_{16}$ are methyl groups, and the others are hydrogen atoms, and the like.

[Chemical Formula 3]

In the formula (3), $R_{17}$ and $R_{18}$ each independently represent a hydrogen atom or an alkyl group. Examples of the alkyl group include a methyl group and the like. In addition, examples of the group represented by the formula (3) include a methylene group, a methylmethylene group, a dimethylmethylene group, and the like.

Xs in the formula (1) and the formula (2) are substituents having an unsaturated carbon-carbon double bond as described above. The substituent having an unsaturated carbon-carbon double bond is not particularly limited. Examples of the substituent include substituents represented by the following formula (4) and the like.

[Chemical Formula 4]

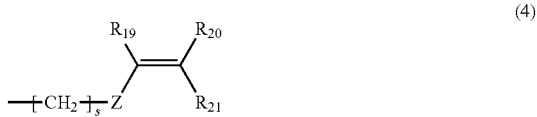

In the formula (4), s represents 0 to 10. In addition, Z represents an arylene group. Also, $R_{19}$ to $R_{21}$ are independent of each other. That is, $R_{19}$ to $R_{21}$ may be the same group or different groups. Moreover, $R_{19}$ to $R_{21}$ represent a hydrogen atom or an alkyl group.

In the formula (4), when s is 0, it represents a compound in which Z is directly bonded to a terminal of a polyphenylene ether.

This arylene group is not particularly limited. Specific examples include a monocyclic aromatic group such as a phenylene group, a polycyclic aromatic group in which the aromatic is not monocyclic but polycyclic aromatic such as a naphthalene ring, and the like. Also, the arylene group also includes derivatives in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. In addition, the alkyl group, although not particularly limited, is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

More specific examples of the substituent include vinylbenzyl groups (ethenylbenzyl groups) such as a p-ethenylbenzyl group and a m-ethenylbenzyl group, a vinylphenyl group, an acrylate group, a methacrylate group, and the like.

Preferable specific examples of the substituents represented by the above formula (4) include a functional group including a vinylbenzyl group. Specific examples include at least one substituent selected from the following formulae (5) and (6) and the like.

[Chemical Formula 5]

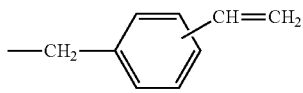

(5)

[Chemical Formula 6]

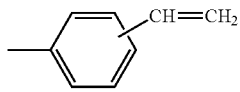

(6)

Examples of the substituent having an unsaturated carbon-carbon double bond include substituents represented by the following formula (7) and the like, in addition to the substituents represented by the above formula (4). Moreover, specific examples of the substituent include an acrylate group, a methacrylate group, and the like.

[Chemical Formula 7]

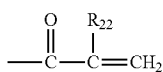

(7)

In the formula (7), $R_{22}$ represents a hydrogen atom or an alkyl group. The alkyl group, although not particularly limited, is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

Examples of the polyphenylene ether chain in the modified polyphenylene ether compound include repeating units represented by the following formula (8), in addition to the repeating units contained in the modified polyphenylene ether compounds represented by the above formulas (1) and (2).

[Chemical Formula 8]

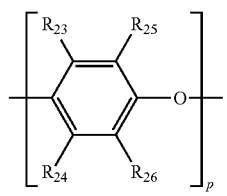

(8)

In the formula (8), p represents 1 to 50, corresponds to the total value of m and n in the formula (1) or formula (2), and is preferably 1 to 30. Also, $R_{23}$ to $R_{26}$ are independent of each other. That is, $R_{23}$ to $R_{26}$ may be the same group or different groups. Further, $R_{23}$ to $R_2$ represent a hydrogen atom, an alkyl group, an alkenyl group, an alkynyl group, a formyl group, an alkylcarbonyl group, an alkenylcarbonyl group, or an alkynylcarbonyl group. Among them, a hydrogen atom and an alkyl group are preferable. In addition, the groups listed in $R_{23}$ to $R_{26}$ are specifically the same as the groups listed in $R_1$ to $R_8$.

The weight average molecular weight (Mw) of the modified polyphenylene ether compound used in the present embodiment is not particularly limited. Specifically, it is preferably 500 to 5000, more preferably 800 to 4000, and further preferably 1000 to 3000. Here, the weight average molecular weight may be a value measured by a general molecular weight measuring method, and specifically includes a value measured using gel permeation chromatography (GPC) and the like.

The modified polyphenylene ether compound having a weight average molecular weight in such ranges has excellent low dielectric properties of the polyphenylene ether, and not only has more excellent heat resistance of a cured product but also has excellent moldability. This is considered due to the following. A normal polyphenylene ether having a weight average molecular weight in such ranges has a relatively low molecular weight, thus the heat resistance of a cured product tends to decrease. In this respect, the modified polyphenylene ether compound has an unsaturated double bond at a terminal, and thus it is considered that a cured product having sufficiently high heat resistance is obtained. Further, the modified polyphenylene ether compound having a weight average molecular weight in such ranges has a relatively low molecular weight, and thus it is considered that the cured product also has excellent moldability. Therefore, it is considered to obtain such a modified polyphenylene ether compound having not only more excellent heat resistance of a cured product but also excellent moldability.

In the modified polyphenylene ether compound used in the present embodiment, an average number of the substituents at a molecular terminal (the number of terminal functional groups) per one molecule of the modified polyphenylene ether compound is not particularly limited. Specifically, the number of terminal functional groups is preferably 1 to 5, more preferably 1 to 3, and further preferably 1.5 to 3. When the number of terminal functional groups is too small, it tends to be difficult to obtain a cured product having sufficient heat resistance. Moreover, when the number of terminal functional groups is too large, reactivity becomes too high, and for example, storability of a resin composition may deteriorate, or malfunctions such as deterioration of fluidity of the resin composition may occur. That is, when such a modified polyphenylene ether compound is used, due to lack of fluidity or the like, for example, molding defect such as generation of a void during multilayer molding might occur, causing a problem of moldability that it is difficult to obtain a highly reliable wiring board.

The number of terminal functional groups of the modified polyphenylene ether compound is, for example, a numerical value representing an average value of the substituents per one molecule in a whole modified polyphenylene ether compound present in 1 mol of the modified polyphenylene ether compound. The number of terminal functional groups can be determined by, for example, measuring the number of hydroxyl groups remaining in the obtained modified polyphenylene ether compound and calculating a decrease from the number of hydroxyl groups of the polyphenylene ether before modification. The decrease from the number of hydroxyl groups in the polyphenylene ether before modification is the number of terminal functional groups. Then, the number of hydroxyl groups remaining in the modified polyphenylene ether compound can be obtained by adding a quaternary ammonium salt associated with a hydroxyl group (tetraethylammonium hydroxide) to a solution of the modified polyphenylene ether compound, and measuring UV absorbance of the mixed solution.

The intrinsic viscosity of the modified polyphenylene ether compound used in the present embodiment is not particularly limited. Specifically, the intrinsic viscosity is preferably 0.03 to 0.12 dl/g, more preferably 0.04 to 0.11 dl/g, and further preferably 0.06 to 0.095 dl/g. When the intrinsic viscosity is too low, the molecular weight tends to be low, and it tends to be difficult to obtain low dielectric properties such as low permittivity and low dielectric loss tangent. On the other hand, when the intrinsic viscosity is too high, viscosity is high, sufficient fluidity cannot be obtained, and moldability of the cured product tends to decrease. Therefore, when the intrinsic viscosity of the modified polyphenylene ether compound is within the above ranges, excellent heat resistance and moldability of the cured product can be realized.

The intrinsic viscosity referred to herein is an intrinsic viscosity measured in methylene chloride at 25° C., and more specifically, for example, a value obtained by measuring a 0.18 g/45 ml methylene chloride solution (liquid temperature 25° C.) with a viscometer, or the like. Examples of the viscometer include AVS500 Visco System manufactured by SCHOTT Instruments GmbH and the like.

A method for synthesizing the modified polyphenylene ether compound used in the present embodiment is not particularly limited as long as the method can synthesize a modified polyphenylene ether compound terminally modified with a substituent having an unsaturated carbon-carbon double bond. Specific examples include a method of reacting a compound in which a substituent having an unsaturated carbon-carbon double bond and a halogen atom are bonded, with polyphenylene ether, and the like.

Examples of the compound in which a substituent having an unsaturated carbon-carbon double bond and a halogen atom are bonded include compounds in which the substituent represented by any one of the above formulas (4) to (7) and a halogen atom are bonded, and the like. Specific examples of the halogen atom include a chlorine atom, a bromine atom, an iodine atom, and a fluorine atom, and among them, a chlorine atom is preferable. Specific examples of the compound in which a substituent having an unsaturated carbon-carbon double bond and a halogen atom are bonded include p-chloromethylstyrene, m-chloromethylstyrene, and the like.

The polyphenylene ether as a raw material is not particularly limited as long as it can finally synthesize a predetermined modified polyphenylene ether compound. Specific examples include a polyphenylene ether composed of 2,6-dimethylphenol and at least one of bifunctional phenol and trifunctional phenol, one containing a polyphenylene ether such as poly(2,6-dimethyl-1,4-phenylene oxide) as a main component, and the like. Also, the bifunctional phenol refers to a phenolic compound having two phenolic hydroxyl groups in a molecule, and examples thereof include tetramethyl bisphenol A and the like. Moreover, the trifunctional phenol refers to a phenolic compound having three phenolic hydroxyl groups in a molecule.

Examples of the method for synthesizing the modified polyphenylene ether compound include the methods described above. Specifically, the polyphenylene ether as described above and the compound in which a substituent having an unsaturated carbon-carbon double bond and a halogen atom are bonded are dissolved in a solvent and stirred. This allows the polyphenylene ether to react with the compound in which a substituent having an unsaturated carbon-carbon double bond and a halogen atom are bonded, to obtain a modified polyphenylene ether compound used in the present embodiment.

The reaction is preferably carried out in the presence of an alkali metal hydroxide. It is considered that this reaction thus proceeds suitably. This is considered because the alkali metal hydroxide functions as a dehydrohalogenating agent, specifically, a dehydrochlorinating agent. That is, it is considered that the alkali metal hydroxide desorbs a hydrogen halide from a phenol group of the polyphenylene ether, the compound in which a substituent having an unsaturated carbon-carbon double bond and a halogen atom are bonded, whereby the substituent having an unsaturated carbon-carbon double bond is bonded to an oxygen atom of the phenol group instead of a hydrogen atom of the phenol group of the polyphenylene ether.

The alkali metal hydroxide is not particularly limited as long as it can function as a dehalogenating agent, and examples thereof include sodium hydroxide and the like. Moreover, the alkali metal hydroxide is normally used in an aqueous solution state, and specifically, it is used as an aqueous sodium hydroxide solution.

Reaction conditions such as reaction time and reaction temperature vary depending on the compound in which a substituent having an unsaturated carbon-carbon double bond and a halogen atom are bonded and the like, and are not particularly limited as long as the above reaction proceeds suitably. Specifically, the reaction temperature is preferably room temperature to 100° C., and more preferably 30° C. to 100° C. Also, the reaction time is preferably 0.5 to 20 hours, and more preferably 0.5 to 10 hours.

The solvent used during the reaction is not particularly limited as long as it can dissolve the polyphenylene ether and the compound in which a substituent having an unsaturated carbon-carbon double bond and a halogen atom are bonded, and does not inhibit a reaction of the polyphenylene ether and the compound in which a substituent having an unsaturated carbon-carbon double bond and a halogen atom are bonded. Specific examples include toluene and the like.

The above reaction is preferably carried out in a state where not only an alkali metal hydroxide but also a phase transfer catalyst is present. That is, the above reaction is preferably carried out in the presence of an alkali metal hydroxide and a phase transfer catalyst. It is considered that the above reaction thus proceeds more suitably. This is considered due to the following. It is considered due to the fact that a phase transfer catalyst is a catalyst which has a function of taking up an alkali metal hydroxide, is soluble both in a polar solvent phase such as water and also in a nonpolar solvent phase such as an organic solvent, and is capable of migrating between these phases. Specifically, in cases where an aqueous sodium hydroxide solution is used as the alkali metal hydroxide and an organic solvent such as toluene which is incompatible with water is used as the solvent, even if the aqueous sodium hydroxide solution is added dropwise to the solvent subjected to the reaction, it is considered that the solvent and the aqueous sodium hydroxide solution separate and the sodium hydroxide is unlikely to migrate to the solvent. Hence, it is considered that the aqueous sodium hydroxide solution added as the alkali metal hydroxide hardly contributes to promotion of the reaction. On the other hand, when the reaction is carried out in the presence of an alkali metal hydroxide and a phase transfer catalyst, it is considered that the alkali metal hydroxide migrates to the solvent in a state of being taken up by the phase transfer catalyst, and the aqueous sodium hydroxide solution is more likely to contribute to the promotion of the reaction. Therefore, it is considered that when the reaction is carried out in the presence of an alkali metal hydroxide and a phase transfer catalyst, the above reaction proceeds suitably.

The phase transfer catalyst is not particularly limited, and examples thereof include quaternary ammonium salts such as tetra-n-butylammonium bromide, and the like.

The resin composition used in the present embodiment preferably contains the modified polyphenylene ether compound obtained as described above as the modified polyphenylene ether compound.

(Crosslinkable Curing Agent)

The crosslinkable curing agent used in the present embodiment is not particularly limited as long as it has an unsaturated carbon-carbon double bond in a molecule. That is, the crosslinkable curing agent may be any as long as it can form a crosslink in the resin composition by being reacted with the modified polyphenylene ether compound to cure the resin composition. The crosslinkable curing agent is preferably a compound having two or more unsaturated carbon-carbon double bonds in the molecule.

The crosslinkable curing agent used in the present embodiment preferably has a weight average molecular weight of 100 to 5000, more preferably 100 to 4000, and further preferably 100 to 3000. When the weight average molecular weight of the crosslinkable curing agent is too low, the crosslinkable curing agent may easily volatilize from a blended component system of the resin composition. Moreover, when the weight average molecular weight of the crosslinkable curing agent is too high, viscosity of varnish of the resin composition and melt viscosity during heat molding may be too high. Therefore, when the weight average molecular weight of the crosslinkable curing agent is within such ranges, a resin composition more excellent in heat resistance of the cured product is obtained. This is considered to be because a crosslink can be suitably formed by the reaction with the modified polyphenylene ether compound. Here, the weight average molecular weight may be a value measured by a general molecular weight measuring method, and specifically includes a value measured using gel permeation chromatography (GPC) and the like.

In the crosslinkable curing agent used in the present embodiment, an average number of unsaturated carbon-carbon double bonds per one molecule of the crosslinkable curing agent (the number of terminal double bonds) varies according to the weight average molecular weight of the crosslinkable curing agent, but, for example, is preferably from 1 to 20, and more preferably from 2 to 18. When the number of terminal double bonds is too small, it tends to be difficult to obtain a cured product having sufficient heat resistance. Moreover, when the number of terminal double bonds is too large, reactivity becomes too high, and for example, storability of a resin composition may deteriorate, or malfunctions such as deterioration of fluidity of a resin composition may occur.

In more consideration of the weight average molecular weight of the crosslinkable curing agent, when the weight average molecular weight of the crosslinkable curing agent is less than 500 (for example, 100 or more and less than 500), the number of terminal double bonds of the crosslinkable curing agent is preferably 1 to 4. Further, when the weight average molecular weight of the crosslinkable curing agent is 500 or more (for example, 500 or more and 5000 or less), the number of terminal double bonds of the crosslinkable curing agent is preferably 3 to 20. In each case, when the number of terminal double bonds is less than the lower limit of the above ranges, the reactivity of the crosslinkable curing agent decreases to lower the crosslink density of the cured product of the resin composition, and heat resistance and Tg may not be sufficiently improved. On the other hand, when the number of terminal double bonds is greater than the upper limit of the above ranges, the resin composition may be easily gelled.

The number of terminal double bonds referred to herein can be known from a product specification value of the crosslinkable curing agent to be used. Specific examples of the number of terminal double bonds referred to herein include a numerical value representing an average value of the number of double bonds per one molecule of all crosslinkable curing agents present in 1 mol of the crosslinkable curing agent, and the like.

Specific examples of the crosslinkable curing agent used in the present embodiment include styrene, divinylbenzene, acrylate compounds, methacrylate compounds, trialkenyl isocyanurate compounds, polybutadiene compounds, maleimide compounds, and the like. Examples of the acrylate compound include polyfunctional methacrylate compounds having two or more acrylic groups in the molecule, such as tricyclodecane dimethanol diacrylate, and the like. Examples of the methacrylate compound include polyfunctional methacrylate compounds having two or more methacrylic groups in the molecule, such as tricyclodecane dimethanol dimethacrylate (DCP), and the like. Examples of the trialkenyl isocyanurate compound include triallyl isocyanurate (TAIC), and the like. Moreover, examples of the crosslinkable curing agent include vinyl compounds having two or more vinyl groups in the molecule (polyfunctional vinyl compounds) such as the polybutadiene described above, vinyl benzyl compounds such as styrene and divinylbenzene having a vinyl benzyl group in the molecule, and the like. Among them, those having two or more carbon-carbon double bonds in the molecule are preferable. Specific examples include trialkenyl isocyanurate compounds, polyfunctional acrylate compounds, polyfunctional methacrylate compounds, polyfunctional vinyl compounds, divinylbenzene compounds, and the like. When these are used, it is considered that crosslinking is more suitably formed by a curing reaction, and heat resistance of the cured product of the resin composition used in the present embodiment can be further increased. In addition, as the crosslinkable curing agent, the exemplified crosslinkable curing agents may be used alone or in combination of two or more. Moreover, as the crosslinkable curing agent, a compound having two or more unsaturated carbon-carbon double bonds in the molecule and a compound having one unsaturated carbon-carbon double bond in the molecule may be used in combination. Specific examples of the compound having one unsaturated carbon-carbon double bond in the molecule include compounds having one vinyl group in the molecule (monovinyl compounds), and the like.

(Content)

The content of the modified polyphenylene ether compound is from 40 parts by mass to 90 parts by mass and preferably from 50 parts by mass to 90 parts by mass, with respect to 100 parts by mass of a total of the modified polyphenylene ether compound and the crosslinkable curing agent. That is, the modified polyphenylene ether compound is from 40% by mass to 90% by mass, with respect to the total mass of the modified polyphenylene ether compound and the crosslinkable curing agent. In addition, the content of the crosslinkable curing agent is from 10 parts by mass to 60 parts by mass and preferably from 10 parts by mass to 50 parts by mass, with respect to 100 parts by mass of a total of the modified polyphenylene ether compound and the crosslinkable curing agent. That is, the content ratio of the modified polyphenylene ether compound and the crosslinkable curing agent is 90:10 to 40:60 and preferably 90:10 to 50:50 by mass ratio. When each content of the modified polyphenylene ether compound and the crosslinkable curing agent is a content that satisfies the above ratio, a resin composition more excellent in heat resistance of the cured product is obtained. This is considered to be because a curing reaction between the modified polyphenylene ether compound and the crosslinkable curing agent proceeds suitably.

(Other Components)

The resin composition according to the present embodiment may contain components (other components) other than the modified polyphenylene ether compound and the crosslinkable curing agent as necessary, as long as the effects of the present invention are not impaired. As other components contained in the resin composition according to the present embodiment, for example, additives such as a silane coupling agent, a flame retardant, an initiator, an antifoaming agent, an antioxidant, a thermal stabilizer, an antistatic agent, an ultraviolet absorber, a dye or pigment, a lubricant, and an inorganic filler may be further contained. Also, the resin composition may contain a thermosetting resin such as an epoxy resin in addition to the modified polyphenylene ether compound and the crosslinkable curing agent.

As described above, the resin composition according to the present embodiment may contain a silane coupling agent. The silane coupling agent is not only contained in the resin composition, but may be contained as a silane coupling agent surface-treated in advance on an inorganic filler contained in the resin composition, or a silane coupling agent surface-treated in advance on a fibrous base material. The silane coupling agent will be described later.

As described above, the resin composition according to the present embodiment may contain a flame retardant. By containing a flame retardant, flame retardancy of the cured product of the resin composition can be increased. The flame retardant is not particularly limited. Specifically, in a field where halogenated flame retardants such as brominated flame retardants are used, for example, ethylene dipentabromobenzene, ethylene bistetrabromoimide, decabromodiphenyl oxide, and tetradecabromodiphenoxybenzene having a melting point of 300° C. or more are preferred. By using a halogenated flame retardant, it is considered that desorption of halogen at a high temperature can be suppressed and decrease in heat resistance can be suppressed. In a field where halogen-free is required, examples of the flame retardant include phosphate ester flame retardants, phosphazene flame retardants, bisdiphenylphosphine oxide flame retardants, and phosphinate flame retardants. Specific examples of the phosphate ester flame retardant include a condensed phosphate ester of dixylenyl phosphate. Specific examples of the phosphazene flame retardant include phenoxyphosphazene. Specific examples of the bisdiphenylphosphine oxide flame retardant include xylylene bisdiphenylphosphine oxide. Specific examples of the phosphinate flame retardant include metal phosphinates such as aluminum dialkylphosphinate. As the flame retardant, the exemplified flame retardants may be used alone or in combination of two or more.

As described above, the resin composition according to the present embodiment may contain an initiator (reaction initiator). Even if the polyphenylene ether resin composition is composed of a modified polyphenylene ether compound and a crosslinkable curing agent, the curing reaction can proceed. Moreover, even composed of only a modified polyphenylene ether, the curing reaction can proceed. However, it may be difficult to raise the temperature until curing proceeds depending on the process conditions, so a reaction initiator may be added. The reaction initiator is not particularly limited as long as it can promote the curing reaction between a modified polyphenylene ether and a crosslinkable curing agent. Specific examples include oxidizing agents such as α,α'-bis(t-butylperoxy-m-isopropyl)benzene, 2,5-dimethyl-2,5-di(t-butylperoxy)-3-hexyne, benzoyl oxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Moreover, a carboxylic acid metal salt or the like can be used in combination as necessary. The curing reaction thus can be further promoted. Among them, α,α'-bis(t-butylperoxy-m-isopropyl)benzene is preferably used. Since α,α'-bis(t-butylperoxy-m-isopropyl)benzene has a relatively high reaction initiation temperature, the promotion of the curing reaction when it does not need to be cured, such as during prepreg drying, can be suppressed, and decrease in storage stability of the polyphenylene ether resin composition can be suppressed. Furthermore, α,α'-bis(t-butylperoxy-m-isopropyl)benzene has low volatility, and therefore does not volatilize during prepreg drying or storage and has good stability. Moreover, the reaction initiators may be used alone or in combination of two or more.

The content of the initiator is not particularly limited, but is, for example, preferably from 0.1 parts by mass to 1.8 parts by mass, more preferably from 0.1 parts by mass to 1.5 parts by mass, and further preferably from 0.3 parts by mass to 1.5 parts by mass, with respect to 100 parts by mass of the total mass of the modified polyphenylene ether compound and the crosslinkable curing agent. When the content of the initiator is too small, the curing reaction between the modified polyphenylene ether compound and the crosslinkable curing agent is unlikely to start suitably. Moreover, when the content of the initiator is too large, the dielectric loss tangent of a cured product of the obtained prepreg will be large, and the cured product is unlikely to exhibit excellent low dielectric properties. Therefore, when the content of the initiator is within the above ranges, the cured product of the prepreg having excellent low dielectric properties is obtained.

As described above, the resin composition according to the present embodiment may contain a filler such as an inorganic filler. The filler is not particularly limited, and examples thereof include those added in order to increase heat resistance and flame retardance of the cured product of the resin composition, and the like. Moreover, heat resistance, flame retardance and the like can be further increased by containing the filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, calcium carbonate, and the like. Among them, as the filler, silica, mica, and talc are preferable, and spherical silica is more preferable. Further, the fillers may be used alone or in combination of two or more. Moreover, the filler may be used as it is, or one surface-treated with a silane coupling agent may be used. Examples of the silane coupling agent include a silane coupling agent having a functional group such as a vinyl group, a styryl group, a methacrylic group, and an acrylic group in a molecule.

The content of the inorganic filler is preferably from 30 parts by mass to 280 parts by mass, preferably from 50 parts by mass to 280 parts by mass, and further preferably from 50 parts by mass to 250 parts by mass, with respect to 100 parts by mass of the total mass of the modified polyphenylene ether compound and the crosslinkable curing agent. When the content of the inorganic filler is too small, an effect exhibited by the inorganic filler is inadequate, and for example, it tends to be difficult to sufficiently increase heat resistance, flame retardance, and the like. When the content of the inorganic filler is too large, permittivities of the cured product of the resin composition and the cured product of the prepreg become high, and the cured products are unlikely to exhibit excellent low dielectric properties. Therefore, when the content of the inorganic filler is within the above ranges, the cured product of the prepreg having excellent low dielectric properties is obtained.

The filler is not particularly limited as described above, but preferably contains an inorganic filler (first inorganic filler) in which a molybdenum compound is present on at least a part of the surface, and more preferably contains the first inorganic filler in combination with a second inorganic filler other than the first inorganic filler.

By containing the first inorganic filler, workability of the substrate obtained by curing the prepreg is enhanced, and for example, wear of a drill used for drilling can be suppressed. As described above, the prepreg includes a glass cloth having a relative permittivity of 4.7 or less and a dielectric loss tangent of 0.0033 or less as the fibrous base material. Such a glass cloth having a relatively low relative permittivity has a relatively high content of hard $SiO_2$ and tends to be brittle. Base on this, a metal-clad laminate and an insulating layer of a wiring board obtained from a prepreg including a glass cloth having a relatively low relative permittivity tend to be brittle. Even if there is such a tendency, a metal-clad laminate and a wiring board excellent in workability such as drilling workability are obtained by containing the first inorganic filler.

The first inorganic filler is not particularly limited as long as it is an inorganic filler in which a molybdenum compound is present on at least a part of the surface. Although it is known that a molybdenum compound can be used as an inorganic filler, the first inorganic filler is not a molybdenum compound itself, but is an inorganic filler in which a molybdenum compound is present on part or all of the surface of an inorganic material other than the molybdenum compound. The phrase "present on the surface" refers to a state that the molybdenum compound is supported on at least a part of the surface of the inorganic filler (inorganic material) other than the molybdenum compound, and a state that the molybdenum compound is covered on at least a part of the surface of the inorganic filler (inorganic material) other than the molybdenum compound.

Examples of the molybdenum compound include molybdenum compounds that can be used as an inorganic filler, and more specifically include zinc molybdate, calcium molybdate, magnesium molybdate, and the like. The molybdenum compounds may be used alone or in combination of two or more. By using these molybdenum compounds, an effect of adding the first inorganic filler, for example, an effect of enhancing the workability can be further exhibited.

The inorganic filler in which the molybdenum compound is present (supported) in the first inorganic filler (such as a supported body of the molybdenum compound in the first inorganic filler) is not particularly limited as long as it is an inorganic filler other than the molybdenum compound. For example, talc is preferably used from the viewpoint of workability, heat resistance, chemical resistance, and the like.

The second inorganic filler is not particularly limited as long as it is an inorganic filler other than the first inorganic filler, and example thereof include silica such as spherical silica, silicon oxide powder and crushed silica, barium sulfate, talc such as baking talc, barium titanate, titanium oxide, clay, alumina, mica, boehmite, zinc borate, zinc stannate, other metal oxides and metal hydrates, and the like. The second inorganic filler may be used alone or in combination of two or more. By using these second inorganic fillers, it is considered that thermal expansion of the laminate and the like can be suppressed and dimensional stability can be enhanced. Further, it is preferable to use silica because there are advantages that heat resistance of the laminate can be increased and the dielectric loss tangent can be lowered.

When the first inorganic filler and the second inorganic filler are contained in combination as the filler, the content of the first inorganic filler is preferably from 0.1 parts by mass to 15 parts by mass, and more preferably from 0.1 parts by mass to 5 parts by mass, with respect to 100 parts by mass of the total mass of the modified polyphenylene ether compound and the crosslinkable curing agent. Also, the content of the second inorganic filler is preferably 200 parts by mass or less, and more preferably from 50 parts by mass to 200 parts by mass, with respect to 100 parts by mass of the total mass.

[Dielectric Properties of Resin Composition]

A cured product of the resin composition preferably has a relative permittivity of 2.6 to 3.8. When the relative permittivity of the cured product of the resin composition is within the above range, a prepreg having excellent low dielectric properties is obtained. When the relative permittivity of the cured product of the resin composition is within the above range, the cured product has excellent low dielectric properties, and the occurrence of skew can be also suppressed. It is preferable to adjust the composition of the resin composition, for example, the content and the like of the inorganic filler, initiator and the like, so that the relative permittivity of the cured product of the resin composition falls within the above range. In addition, the cured product of the resin composition preferably has a dielectric loss tangent of 0.004 or less, more preferably 0.003 or less, and further preferably 0.002 or less. The relative permittivity and dielectric loss tangent referred to herein include the relative permittivity and dielectric loss tangent of the cured product of the resin composition at 10 GHz and the like, and more specifically include the relative permittivity and dielectric loss tangent of the cured product of the resin composition at 10 GHz and the like, measured by a cavity resonator perturbation method.

[Resin Varnish]

The resin composition used in the present embodiment may be prepared into a varnish form and used. For example, when producing a prepreg, it may be prepared into a varnish form and used for the purpose of impregnating a base material (fibrous base material) for forming the prepreg. That is, the resin composition may be prepared into a varnish form (resin varnish) and used. Also, in the resin composition used in the present embodiment, the modified polyphenylene ether compound and the crosslinkable curing agent are dissolved in the resin varnish. Such a varnish-like composition (resin varnish) is prepared, for example, as follows.

First, components that can be dissolved in an organic solvent are charged into the organic solvent and dissolved. At this time, heating may be performed as necessary. Thereafter, a component that does not dissolve in an organic solvent, which is used as necessary, is added thereto and dispersed using a ball mill, a bead mill, a planetary mixer, a roll mill or the like, until the solution becomes a predetermined dispersed state, thereby preparing a varnish-like composition. The organic solvent used here is not particularly limited as long as it dissolves the modified polyphenylene ether compound and the crosslinkable curing agent and does not inhibit the curing reaction. Specific examples include toluene, methyl ethyl ketone (MEK), and the like.

[Fibrous Base Material]

The fibrous base material used in the present embodiment is a glass cloth having a relative permittivity of 4.7 or less and a dielectric loss tangent of 0.0033 or less. Examples of the fibrous base material include quartz glass (Q glass) cloth, QL glass cloth, L2 glass cloth, and the like.

The fibrous base material is preferably a glass cloth having a relative permittivity of 4.7 or less and a dielectric loss tangent of 0.0033 or less in order to reduce transmission loss and skew in the wiring board, and is preferably a Q glass cloth having a relative permittivity of more than 3.3 and 3.8 or less and a dielectric loss tangent of 0.0017 or less in order to further reduce transmission loss and skew in the wiring board. Also, the fibrous base material is preferably a glass cloth having a relative permittivity and dielectric loss tangent within the range of the following L2 glass cloth or QL glass cloth (a relative permittivity of more than 3.8 and 4.7 or less and a dielectric loss tangent of more than 0.0015 and 0.0033 or less), and preferably an L2 glass cloth having a relative permittivity of more than 4.2 and 4.7 or less and a dielectric loss tangent of more than 0.0015 and 0.0025 or less in order to reduce transmission loss and skew and enhance drilling workability.

Quartz glass cloth is glass cloth made of quartz glass yarn, and glass constituting the glass cloth is quartz glass (Q glass) having a silicon dioxide ($SiO_2$) content of 99% by mass or more. The quartz glass cloth is obtained, for example, by weaving using quartz glass fibers.

The L2 glass cloth is glass cloth made of L2 glass yarn, and glass constituting the glass cloth is L2 glass containing about 50% by mass to 60% by mass of silicon dioxide ($SiO_2$), 10% by mass to 25% by mass of $B_2O_3$, 15% by mass or less of CaO, and 3% by mass or more of $P_2O_5$. The L2 glass cloth is obtained, for example, by weaving using L2 glass fibers.

The QL glass cloth is glass cloth having a hybrid structure composed of the Q glass and the L glass. The L glass is glass containing about 50% by mass to 60% by mass of silicon dioxide ($SiO_2$), 10% by mass to 25% by mass of $B_2O_3$, and 15% by mass or less of CaO. The QL glass cloth is, for example, a glass cloth obtained by weaving using a Q glass yarn and an L glass yarn, and is usually a glass cloth obtained by weaving using an L glass yarn as a warp, and using a Q glass yarn as a weft.

The relative permittivity (Dk) and dielectric loss tangent (Df) of each glass cloth are as follows.

The Q glass cloth has a Dk of more than 3.3 and 3.8 or less and a Df of 0.0017 or less.

The L2 glass cloth has a Dk of more than 4.2 and 4.7 or less and a Df of more than 0.0015 and 0.0025 or less.

The QL glass cloth has a Dk of more than 3.8 and 4.3 or less and a Df of more than 0.0023 and 0.0033 or less.

The L glass cloth has a Dk of more than 4.2 and 4.7 or less and a Df of more than 0.0033 and 0.0043 or less.

In the present embodiment, the relative permittivity (Dk) and dielectric loss tangent (Df) of each glass cloth are values obtained by the following measuring methods. First, a substrate (copper-clad laminate) is prepared so that the resin content per 100% by mass of the prepreg is 60% by mass, and a copper foil is removed from the prepared copper-clad laminate to obtain a sample for evaluation of relative permittivity (Dk) and dielectric loss tangent (Df). Dk and Df of the obtained sample at a frequency of 10 GHz were measured by the cavity resonator perturbation method using a network analyzer (N5230A manufactured by Keysight Technologies LLC). From the Dk and Df values of the obtained sample (the cured product of the prepreg), Dk and Df of the glass cloth are calculated, based on the Dk and Df at 10 GHz in which the cured product of the resin composition was measured by the cavity resonator perturbation method, from the volume fraction of the glass cloth and the resin composition used for substrate preparation.

The fibrous base material used in the present embodiment may be used as it is, or one surface-treated with a silane coupling agent may be used. Examples of the silane coupling agent include a silane coupling agent having a functional group such as a vinyl group, a styryl group, a methacrylic group, and an acrylic group in a molecule.

As the shape of the fibrous base material, glass cloth is used. Moreover, the glass cloth is more preferably adjusted for air permeability by being subjected to opening treatment. Examples of the opening treatment include treatment performed by spraying high-pressure water on glass cloth, treatment performed by pressing the yarn continuously at an appropriate pressure with a press roll and compressing it flatly, and the like. The air permeability of the glass cloth is preferably 200 $cm^3/cm^2$/sec or less, more preferably 3 to 100 $cm^3/cm^2$/sec, and further preferably 3 to 50 $cm^3/cm^2$/sec. When this air permeability is too high, opening of the glass cloth tends to be insufficient. Insufficient opening of the glass cloth causes pinholes during prepreg production, increases the coarseness and minuteness of the yarn to cause skew, and causes unevenness during processing such as drilling. Moreover, when the air permeability is too small, it means that strong opening treatment was performed and problems such as fluff tend to occur in the glass cloth. The air permeability is an air permeability measured with a Frazier type air permeability tester in accordance with JIS R3420 (2013). Further, the thickness of the fibrous base material is not particularly limited, but is preferably 0.01 to 0.2 mm, more preferably 0.02 to 0.15 mm, and further preferably 0.03 to 0.1 mm.

[Silane Coupling Agent]

The prepreg may contain a silane coupling agent. This silane coupling agent is not particularly limited, and examples thereof include silane coupling agents having an unsaturated carbon-carbon double bond in a molecule, and the like. The method for adding the silane coupling agent is not limited as long as it is contained in the prepreg. As the method for adding the silane coupling agent, for example, when the resin composition is produced, the silane coupling agent may be added by adding an inorganic filler surface-treated in advance with the silane coupling agent, or the silica and the silane coupling agent may be added by an integral blend method. Moreover, when the prepreg is produced, the silane coupling agent may be added to the prepreg by using a fibrous base material surface-treated in advance with the silane coupling agent. Among them, the method of adding an inorganic filler surface-treated in advance with the silane coupling agent and the method of using a fibrous base material surface-treated in advance with the silane coupling agent are preferable. That is, the inorganic filler is preferably an inorganic filler surface-treated in advance with a silane coupling agent, and the fibrous base material is preferably a fibrous base material surface-treated in advance with a silane coupling agent. Moreover, as the method for adding the silane coupling agent, a method using a fibrous base material surface-treated in advance with the silane coupling agent is more preferable, and a method combining the method of adding an inorganic filler surface-treated in advance with the silane coupling agent and the method of using a fibrous base material surface-treated in advance with the silane coupling agent is further preferable. That is, it is preferred that an inorganic filler surface-treated in advance with a silane coupling agent is used as the inorganic filler, and a fibrous base material surface-treated in advance with a silane coupling agent is used as the fibrous base material.

The silane coupling agent having an unsaturated carbon-carbon double bond in the molecule is not particularly limited as long as it is a silane coupling agent having an unsaturated carbon-carbon double bond in the molecule. Specific examples of the silane coupling agent include a silane coupling agent having at least one functional group selected from the group consisting of a vinyl group, a styryl group, a methacrylic group and an acrylic group, and the like. That is, examples of the silane coupling agent include compounds having at least one of a vinyl group, a styryl group, a methacrylic group, and an acrylic group as a reactive functional group, and further having a hydrolyzable group such as a methoxy group or an ethoxy group, and the like.

Examples of the silane coupling agent include vinyltriethoxysilane, vinyltrimethoxysilane and the like, as those having a vinyl group.

Examples of the silane coupling agent include p-styryltrimethoxysilane, p-styryltriethoxysilane and the like, as those having a styryl group.

Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-methacryloxypropylethyldiethoxysilane and the like, as those having a methacrylic group.

Examples of the silane coupling agent include 3-acryloxypropyltrimethoxysilane, 3-acryloxypropyltriethoxysilane and the like, as those having an acrylic group.

Among the above, the silane coupling agent is preferably a silane coupling agent having at least one of a methacrylic group and an acrylic group in the molecule. That is, the silane coupling agent is preferably a silane coupling agent having a methacrylic group and a silane coupling agent having an acrylic group. When these silane coupling agents are used, heat resistance of the obtained prepreg is increased, and for example, sufficiently high heat resistance can be exhibited even under severe conditions of moisture absorption.

[Dielectric Properties of Prepreg]

A cured product of the prepreg has a relative permittivity of 2.7 to 3.8. Also, a cured product of the prepreg has a dielectric loss tangent of 0.002 or less. The dielectric loss tangent of the cured product of the prepreg is preferably as small as possible, and is preferably 0. Therefore, the dielectric loss tangent of the cured product of the prepreg is preferably from 0 to 0.002. When the relative permittivity and dielectric loss tangent of the cured product of the prepreg are within the above ranges, the cured product has excellent low dielectric properties. It is preferable to adjust the composition of the resin composition, for example, the content and the like of the inorganic filler, initiator and the like, so that the relative permittivity and dielectric loss tangent of the cured product of the prepreg fall within the above ranges. The relative permittivity and dielectric loss tangent referred to herein include the relative permittivity and dielectric loss tangent of the cured product of the prepreg at 10 GHz and the like.

[Resin Content in Prepreg]

The resin content in the prepreg is not particularly limited, but is, for example, preferably from 40% by mass to 90% by mass, more preferably from 50% by mass to 90% by mass, and further preferably from 60% by mass to 80% by mass. When the resin content is too low, it is difficult to obtain low dielectric properties. On the other hand, when the resin content is too high, the coefficient of thermal expansion (CTE) tends to increase or the plate thickness accuracy tends to decrease. The resin content referred to herein is a ratio of a mass obtained by subtracting a mass of the fibrous base material from a mass of the prepreg to a mass of the prepreg [=(Mass of Prepreg−Mass of Fibrous Base Material)/Mass of Prepreg×100].

[Thickness of Prepreg]

The thickness of the prepreg is not particularly limited, but is, for example, preferably 0.015 to 0.2 mm, more preferably 0.02 to 0.15 mm, and further preferably 0.03 to 0.13 mm. When the prepreg is too thin, the number of prepregs required to obtain a desired substrate thickness increases. On the other hand, when the prepreg is too thick, the resin content tends to be low, and it is difficult to obtain desired low dielectric properties.

[Production Method]

Next, a method for producing the prepreg according to the present embodiment will be described.

The method for producing the prepreg is not particularly limited as long as the prepreg can be produced. Specifically, when producing a prepreg, the resin composition used in the present embodiment described above is often prepared into a varnish form and used as resin varnish as described above.

Examples of the method for producing a prepreg 1 include a method of impregnating a fibrous base material 3 with a resin composition 2, for example, a resin composition 2 prepared in a varnish form, and then drying it.

The resin composition 2 is impregnated into the fibrous base material 3 by dipping and coating or the like. If necessary, the impregnation can be repeated several times.

At this time, it is also possible to finally adjust to a desired composition and impregnation amount by repeating impregnation using a plurality of resin compositions having different compositions and concentrations.

The fibrous base material 3 impregnated with the resin composition (resin varnish) 2 is heated at desired heating conditions, for example, at 80° C. or more and 180° C. or less for 1 minute or more and 10 minutes or less. By heating, the prepreg 1 before curing (A-stage) or in a semi-cured state (B-stage) is obtained.

<Metal-Clad Laminate>

Figure 2:
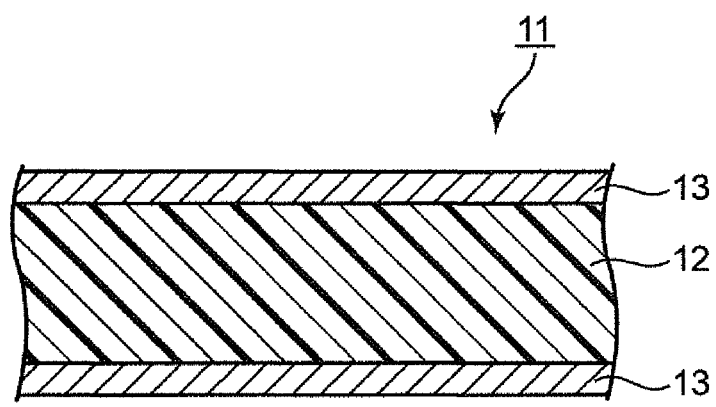
FIG. 2 is a schematic cross-sectional view showing an example of a metal-clad laminate according to an embodiment of the present invention.

FIG. 2 is a schematic cross-sectional view showing an example of a metal-clad laminate 11 according to the embodiment of the present invention.

As shown in FIG. 2, the metal-clad laminate 11 is constituted by an insulating layer 12 containing a cured product of a prepreg 1 shown in FIG. 1, and a metal foil 13 laminated together with the insulating layer 12. That is, the metal-clad laminate 11 has the insulating layer 12 containing the cured product of the prepreg 1 and the metal foil 13 bonded to the insulating layer 12. Also, the insulating layer 12 may be made of the cured product of the prepreg 1.

Examples of a method of preparing the metal-clad laminate 11 including the prepreg 1 include a method of stacking one or more sheets of the prepregs 1, further stacking the metal foil 13 such as a copper foil on both upper and lower surfaces or one surface thereof, and integrally laminating the metal foil 13 and the prepreg 1 by heat press molding, thereby preparing double-sided metal foil-clad or single-sided metal foil-clad laminate 11. That is, the metal-clad laminate 11 is obtained by laminating the metal foil 13 on the prepreg 1 and heat press molding the laminate. Also, the heat press conditions can be appropriately set depending on the thickness of the metal-clad laminate 11 to be produced, the type of the composition of the prepreg 1, and the like. For example, the temperature can be 170° C. to 210° C., the pressure can be 3.5 MPa to 4 MPa, and the time can be 60 minutes to 150 minutes. Moreover, a metal-clad laminate may be produced, without using a prepreg. Examples include a method of applying a varnish-like resin composition or the like onto a metal foil to form a layer containing the resin composition on the metal foil, and then heating and pressing them, and the like.

The prepreg according to the present embodiment is a prepreg that can suitably produce a wiring board excellent in heat resistance, in which loss in signal transmission and signal quality degradation due to skew are sufficiently suppressed. Therefore, the metal-clad laminate obtained by using this prepreg, as well as the prepreg, can suitably produce a wiring board excellent in heat resistance, in which loss in signal transmission and signal quality degradation due to skew are sufficiently suppressed.

Figure 3:
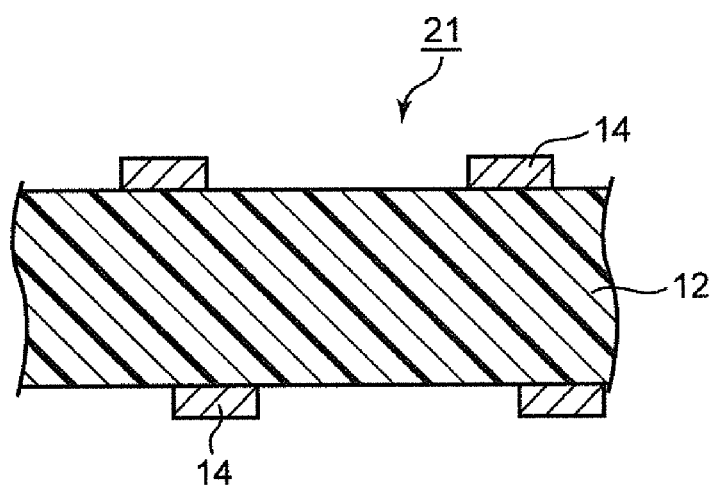
FIG. 3 is a schematic cross-sectional view showing an example of a wiring board according to an embodiment of the present invention.

FIG. 3 is a schematic cross-sectional view showing an example of a wiring board 21 according to the embodiment of the present invention.

As shown in FIG. 3, the wiring board 21 according to the present embodiment is constituted by the insulating layer 12 containing the cured product of the prepreg 1 shown in FIG. 1, and the wiring 14 laminated together with the insulating layer 12 and formed by partially removing the metal foil 13. That is, the wiring board 21 has the insulating layer 12 containing the cured product of the prepreg 1 and the wiring 14 bonded to the insulating layer 12. Also, the insulating layer 12 may be made of the cured product of the prepreg 1.

As a method of preparing the wiring board 21 including the prepreg 1, wiring is formed by etching the metal foil 13 on the surface of the metal-clad laminate 11 prepared as described above or the like, whereby the wiring board 21 provided with a wiring as a circuit on the surface of the insulating layer 12 can be obtained. That is, the wiring board 21 is obtained by forming a circuit by partially removing the metal foil 13 on the surface of the metal-clad laminate 11.

The prepreg according to the present embodiment is a prepreg that can suitably produce a wiring board excellent in heat resistance, in which loss in signal transmission and signal quality degradation due to skew are sufficiently suppressed. Therefore, the wiring board obtained using this prepreg is a wiring board excellent in heat resistance, in which loss in signal transmission and signal quality degradation due to skew are sufficiently suppressed.

The present specification discloses various aspects of the technologies as described above, and the main technologies are summarized below.

One aspect of the present invention is a prepreg including a resin composition or a semi-cured product of the resin composition, and a glass cloth, wherein the resin composition contains a modified polyphenylene ether compound terminally modified with a substituent having an unsaturated carbon-carbon double bond, and a crosslinkable curing agent having an unsaturated carbon-carbon double bond in a molecule, a content of the modified polyphenylene ether compound is from 40% by mass to 90% by mass with respect to a total mass of the modified polyphenylene ether compound and the crosslinkable curing agent, a cured product of the resin composition has a relative permittivity of 2.6 to 3.8, the glass cloth has a relative permittivity of 4.7 or less and a dielectric loss tangent of 0.0033 or less, and a cured product of the prepreg has a relative permittivity of 2.7 to 3.8 and a dielectric loss tangent of 0.002 or less.

According to such a configuration, it is possible to provide a prepreg that can suitably produce a wiring board excellent in heat resistance, in which loss in signal transmission and signal quality degradation due to skew are sufficiently suppressed. First, it is considered that a prepreg obtained by using a quartz glass cloth having a relatively low permittivity as the fibrous base material constituting the prepreg has excellent low dielectric properties of a cured product thereof. However, only by simply using quartz glass cloth as the fibrous base material, there have been cases where low dielectric properties of the cured product are not sufficiently high, or heat resistance of the cured product is not sufficiently high. Therefore, the prepreg not only uses quartz glass cloth as the fibrous base material, but also uses a resin composition containing the modified polyphenylene ether compound and the crosslinkable curing agent in a predetermined ratio, as the resin composition constituting the prepreg. Further, in the prepreg, a composition of the resin composition, a state of quartz glass cloth and the like are adjusted so that the relative permittivity of the cured product of the resin composition, and the relative permittivity and dielectric loss tangent of the cured product of the prepreg are within the above ranges. Thus, it is possible to obtain a prepreg that can suitably produce a wiring board excellent in heat resistance, in which loss in signal transmission and signal quality degradation due to skew are sufficiently suppressed.

Also, in the prepreg, the fibrous base material is preferably a base material surface-treated with a silane coupling agent having an unsaturated carbon-carbon double bond in a molecule.

According to such a configuration, it is possible to provide a prepreg that can more suitably produce a wiring board excellent in heat resistance, in which loss in signal transmission and signal quality degradation due to skew are sufficiently suppressed.

Moreover, in the prepreg, the crosslinkable curing agent is preferably at least one selected from the group consisting of styrene, divinylbenzene, acrylate compounds, methacrylate compounds, trialkenyl isocyanurate compounds, polybutadiene compounds, and maleimide compounds.

According to such a configuration, it is possible to provide a prepreg that can more suitably produce a wiring board excellent in heat resistance, in which loss in signal transmission and signal quality degradation due to skew are sufficiently suppressed.

Further, in the prepreg, the silane coupling agent is preferably a silane coupling agent having at least one functional group selected from the group consisting of a vinyl group, a styryl group, a methacrylic group, and an acrylic group in the molecule.

According to such a configuration, it is possible to provide a prepreg that can more suitably produce a wiring board excellent in heat resistance, in which loss in signal transmission and signal quality degradation due to skew are sufficiently suppressed.

Furthermore, in the prepreg, the substituent in the modified polyphenylene ether compound is preferably at least one selected from the group consisting of a vinylbenzyl group, a vinyl group, an acrylate group, and a methacrylate group.

According to such a configuration, it is possible to provide a prepreg that can more suitably produce a wiring board excellent in heat resistance, in which loss in signal transmission and signal quality degradation due to skew are sufficiently suppressed.

Further, another aspect of the present invention is a metal-clad laminate including an insulating layer containing the cured product of the prepreg, and a metal foil.

According to such a configuration, it is possible to provide a metal-clad laminate that can more suitably produce a wiring board excellent in heat resistance, in which loss in signal transmission and signal quality degradation due to skew are sufficiently suppressed.

Furthermore, another aspect of the present invention is a wiring board including an insulating layer containing the cured product of the prepreg, and wiring.

According to such a configuration, it is possible to provide a wiring board excellent in heat resistance, in which loss in signal transmission and signal quality degradation due to skew are sufficiently suppressed.

According to the present invention, it is possible to provide a prepreg and a metal-clad laminate that can suitably produce a wiring board excellent in heat resistance, in which loss in signal transmission and signal quality degradation due to skew are sufficiently suppressed. In addition, a wiring board excellent in heat resistance, in which loss in signal transmission and signal quality degradation due to skew are sufficiently suppressed is provided.

Hereinafter, the present invention will be further specifically described with reference to examples. However, the scope of the present invention is not limited to these examples.

EXAMPLES

Examples 1 to 13, Comparative Examples 1 to 6

In this example, components used when preparing a prepreg will be described.

(Polyphenylene Ether: PPE)

Modified PPE-1: A modified polyphenylene ether in which terminal hydroxyl groups of polyphenylene ether have been modified with methacrylic groups (a modified polyphenylene ether compound represented by the above formula (2), wherein Xs are methacrylic groups, and Y is a dimethylmethylene group (represented by the formula (3), wherein $R_{17}$ and $R_{18}$ in the formula (3) are methyl groups), SA9000 manufactured by SABIC Innovative Plastics, weight average molecular weight Mw 2000, the number of terminal functional groups 2)

Modified PPE-2: A modified polyphenylene ether obtained by reacting polyphenylene ether and chloromethylstyrene.

Specifically, these are modified polyphenylene ethers obtained by reacting as follows.

First, a 1 liter three-necked flask equipped with a temperature controller, a stirrer, a cooling apparatus and a dropping funnel was charged with 200 g of a polyphenylene ether (SA90 manufactured by SABIC Innovative Plastics, the number of terminal hydroxyl groups 2, weight average molecular weight Mw 1700), 30 g of a 50:50 (mass ratio) mixture of p-chloromethylstyrene and m-chloromethylstyrene (chloromethylstyrene:CMS manufactured by Tokyo Chemical Industry Co., Ltd.), 1.227 g of tetra-n-butylammonium bromide as a phase transfer catalyst, and 400 g of toluene, and the contents were stirred. Then, stirring was carried out until the polyphenylene ether, the chloromethylstyrene and the tetra-n-butylammonium bromide were dissolved in the toluene. At that time, the contents were gradually heated, and heated until the liquid temperature finally reached 75° C. Then, an aqueous sodium hydroxide solution (20 g of sodium hydroxide/20 g of water) was added dropwise to the solution over a period of 20 minutes as an alkali metal hydroxide. Thereafter, the mixture was further stirred at 75° C. for 4 hours. Next, after neutralizing the contents of the flask with 10% by mass hydrochloric acid, a large amount of methanol was charged thereinto. Thus, a precipitate was formed in the liquid in the flask. That is, the product contained in the reaction solution in the flask was reprecipitated. Then, the precipitate was taken out by filtration, washed three times with a 80:20 (mass ratio) mixed solution of methanol and water, and then dried at 80° C. under reduced pressure for 3 hours.

The resulting solid was analyzed by $^1$H-NMR (400 MHz, CDCl$_3$, TMS). As a result of NMR measurement, a peak attributable to a vinylbenzyl group (ethenylbenzyl group) was confirmed at 5 to 7 ppm. Hence, it was possible to confirm that the resulting solid was a modified polyphenylene ether having a vinylbenzyl group in a molecule as the substituent at the molecular terminal. Specifically, it was possible to confirm that the resulting solid was an ethenylbenzylated polyphenylene ether. The resulting modified polyphenylene ether compound is a modified polyphenylene ether compound represented by the above formula (2), wherein Xs are vinylbenzyl groups (ethenylbenzyl groups), and Y is a dimethylmethylene group (represented by the formula (3), wherein $R_{17}$ and $R_{18}$ in the formula (3) are methyl groups).

Moreover, the number of terminal functional groups of the modified polyphenylene ether was measured as follows.

First, the modified polyphenylene ether was accurately weighed. The weight at that time is defined as X (mg). Then, the weighed modified polyphenylene ether was dissolved in 25 mL of methylene chloride, and 100 µL of 10% by mass solution of tetraethylammonium hydroxide (TEAH) in ethanol (TEAH:ethanol (volume ratio)=15:85) was added to the solution. Thereafter, the absorbence (Abs) at 318 nm was measured using a UV spectrophotometer (UV-1600 manufactured by Shimadzu Corporation). And, from the measurement result, the number of terminal hydroxyl groups of the modified polyphenylene ether was calculated using the following formula.

Amount of Remaining OH(µmol/g)=[(25×Abs)/(ε× OPL×$X$)]×10$^6$

Here, ε represents an extinction coefficient, which is 4,700 L/mol·cm. Also, OPL is an optical path length of a cell, which is 1 cm.

Then, since the calculated amount of remaining OH (the number of terminal hydroxyl groups) of the modified polyphenylene ether was almost zero, it was found that the hydroxyl groups of the polyphenylene ether before modification were substantially modified. Base on this, it was found that the decrease from the number of terminal hydroxyl groups of the polyphenylene ether before modification was the number of terminal hydroxyl groups of the polyphenylene ether before modification. That is, it was found that the number of terminal hydroxyl groups of the polyphenylene ether before modification was the number of terminal functional groups of the modified polyphenylene ether. Namely, the number of terminal functional groups was two.

In addition, the intrinsic viscosity (IV) of the modified polyphenylene ether was measured in methylene chloride at 25° C. Specifically, the intrinsic viscosity (IV) of the modified polyphenylene ether was determined by measuring a 0.18 g/45 mL solution of the modified polyphenylene ether in methylene chloride (liquid temperature 25° C.) with a viscometer (AVS500 Visco System manufactured by Schott Instruments GmbH). As a result, the intrinsic viscosity (IV) of the modified polyphenylene ether was 0.086 dl/g.

Further, the molecular weight distribution of the modified polyphenylene ether was measured using GPC. Then, the weight average molecular weight (Mw) was calculated from the resulting molecular weight distribution. As a result, Mw was 2300.

Unmodified PPE: Polyphenylene ether (SA90 manufactured by SABIC Innovative Plastics, intrinsic viscosity (IV) 0.083 dl/g, the number of terminal hydroxyl groups 2, weight average molecular weight Mw 1700)
(Crosslinkable Curing Agent)
TAIC: Triallyl isocyanurate (TAIC manufactured by Nihon Kasei CO., LTD, molecular weight 249, the number of terminal double bonds 3)
DCP: Tricyclodecane dimethanol dimethacrylate (DCP manufactured by Shin-Nakamura Chemical Co., Ltd., the number of terminal double bonds 2)
(Epoxy Resin)
Epoxy resin: Dicyclopentadiene type epoxy resin (Epiclon HP7200 manufactured by DIC Corporation, the average number of epoxy groups 2.3)
(Initiator)
PBP: 1,3-Bis(butylperoxyisopropyl) benzene (Perbutyl P manufactured by NOF Corporation)
(Catalyst)
2E4MZ: 2-Ethyl-4-methylimidazole (imidazole catalyst, 2E4MZ manufactured by SHIKOKU CHEMICALS CORPORATION)
(Inorganic Filler)
Silica: Silica particles surface-treated with a silane coupling agent having a vinyl group in a molecule (SC2300-SVJ manufactured by Admatechs Company Limited)
Alumina: Alumina particles (AES-11C manufactured by Sumitomo Chemical Co., Ltd.)
Zinc molybdate talc: Talc in which zinc molybdate is present on at least a part of the surface (zinc molybdate-carrying talc, KG-911C manufactured by Huber)
(Fiber Base Material)
Q Glass: Quartz glass cloth surface-treated with a silane coupling agent having a methacrylic group in a molecule (SQF1078C-04 manufactured by Shin-Etsu Chemical Co., Ltd., #1078 type, relative permittivity: 3.5, dielectric loss tangent: 0.0015, air permeability: 25 $cm^3/cm^2/sec$)
QL Glass: QL glass cloth (manufactured by Asahi Kasei Corporation, #1078 type, relative permittivity: 4.0, dielectric loss tangent: 0.0028, air permeability: 20 $cm^3/cm^2/sec$)
L2 Glass: L2 glass cloth (manufactured by Asahi Kasei Corporation, #1078 type, relative permittivity: 4.4, dielectric loss tangent: 0.0018, air permeability: 20 $cm^3/cm^2/sec$)
L Glass: L glass cloth (general-purpose low dielectric glass cloth, L1078 manufactured by Asahi Kasei Co., Ltd., #1078 type, relative permittivity: 4.5, dielectric loss tangent: 0.0038, air permeability: 20 $cm^3/cm^2/sec$)
[Preparation Method]

First, components other than the inorganic filler were added to toluene and mixed at a blending ratio (parts by mass) shown in Tables 1 and 2 so that the solid content concentration was 60% by mass. The mixture was stirred at room temperature for 60 minutes. Thereafter, the inorganic filler was added to the resulting liquid, and the inorganic filler was dispersed by a bead mill. Thus, a varnish-like resin composition (varnish) was obtained.

Next, after impregnating the fibrous base material (the glass cloth) shown in Tables 1 and 2 with the obtained varnish, prepregs were prepared by heating and drying at 130° C. for about 3 to 8 minutes. At that time, the content (resin content) of the components constituting the resin by a curing reaction, such as a modified polyphenylene ether compound and a crosslinkable curing agent, is adjusted to the value % shown in Tables 1 and 2.

Then, 4 sheets of the resulting prepregs were stacked and heated and pressed under conditions of a temperature of 200° C., 2 hours, and a pressure of 3 MPa, to obtain evaluation substrates (cured products of the prepregs).

In addition, the resulting prepregs were stacked in the number of layers shown in Tables 1 and 2, and a copper foil (FV-WS manufactured by FURUKAWA ELECTRIC CO., LTD.) was placed on both sides of the prepregs to form pressurized bodies. The pressurized bodies were heated and pressed under conditions of a temperature of 200° C. and a pressure of 3 MPa for 2 hours to prepare copper foil-clad laminates that were evaluation substrates with the copper foils bonded to both sides (metal-clad laminates), with a thickness of 200 μm.

Further, evaluation substrates (cured products of the resin compositions) made of cured products of the resin compositions were also produced in the same manner as the evaluation substrates (the cured products of the prepregs) except that the fibrous base material was not used.

The evaluation substrates (the cured products of the prepregs, the metal-clad laminates, the cured products of resin compositions) prepared as described above were evaluated by the following method.

[Dielectric Properties (Relative Permittivity and Dielectric Loss Tangent)]

The relative permittivity and dielectric loss tangent of the evaluation substrates (the cured products of the prepregs and the cured products of the prepreg resin compositions) at 10 GHz were measured by a cavity resonator perturbation method. Specifically, the relative permittivity and dielectric loss tangent of the evaluation substrates at 10 GHz were measured using a network analyzer (N5230A manufactured by Keysight Technologies LLC).

[Skew: Delay Time Difference]

One metal foil (copper foil) of the evaluation substrate (the metal-clad laminate) was processed to form ten wires having a line width of 100 to 300 μm, a line length of 100 mm, and a line interval of 20 mm. Prepregs in the number of layers shown in Tables 1 and 2 and a metal foil (copper foil) were secondarily laminated on the surface of the side on which the wires were formed, of the substrate on which the wires were formed, to prepare a three-layer laminate. The line width of the wires was adjusted so that a characteristic impedance of a circuit after preparing the three-layer laminate was 50Ω.

Delay time of the obtained three-layer laminate at 20 GHz was measured. A difference between the maximum value and the minimum value of the obtained delay time was calculated. The difference thus calculated is a delay time difference, and when the delay time difference is large, skew of a differential signal is likely to occur. Therefore, the delay time difference becomes an index for evaluating a signal quality due to the skew. That is, when the delay time difference is large, the signal quality is likely to be deteriorated due to the skew, and when the delay time difference is small, the signal quality degradation due to the skew is not likely to occur. Therefore, as an evaluation of the skew, when the calculated value was 2 picoseconds or less, it was evaluated as "Very Good", when it was more than 2 picoseconds and less than 5 picoseconds, it was evaluated as "Good", and when it was 5 picoseconds or more, it was evaluated as "Poor".

[Glass Transition Temperature (Tg)]

Tg of the prepreg was measured using a viscoelastic spectrometer "DMS100" manufactured by Seiko Instruments Inc. At this time, dynamic viscoelasticity measurement (dynamic mechanical analysis (DMA)) was performed with a bending module at a frequency of 10 Hz, and the temperature at which tan δ showed maximum when the temperature was raised from room temperature to 280° C. at a temperature raising rate of 5° C./min was defined as Tg.

[Transmission Loss]

One metal foil (copper foil) of the evaluation substrate (the metal-clad laminate) was processed to form ten wires having a line width of 100 to 300 μm, a line length of 1000 mm, and a line interval of 20 mm. Prepregs in the number of layers shown in Tables 1 and 2 and a metal foil (copper foil) were secondarily laminated on the surface of the side on which the wires were formed, of the substrate on which the wires were formed, to prepare a three-layer laminate. The line width of the wires was adjusted so that a characteristic impedance of a circuit after preparing the three-layer laminate was 50Ω.

The transmission loss (passing loss) (dB/m) at 20 GHz of the wiring formed on the obtained three-layer laminate was measured using a network analyzer (N5230A manufactured by Keysight Technologies LLC).

[Drill Wear Rate]

Figure 4:
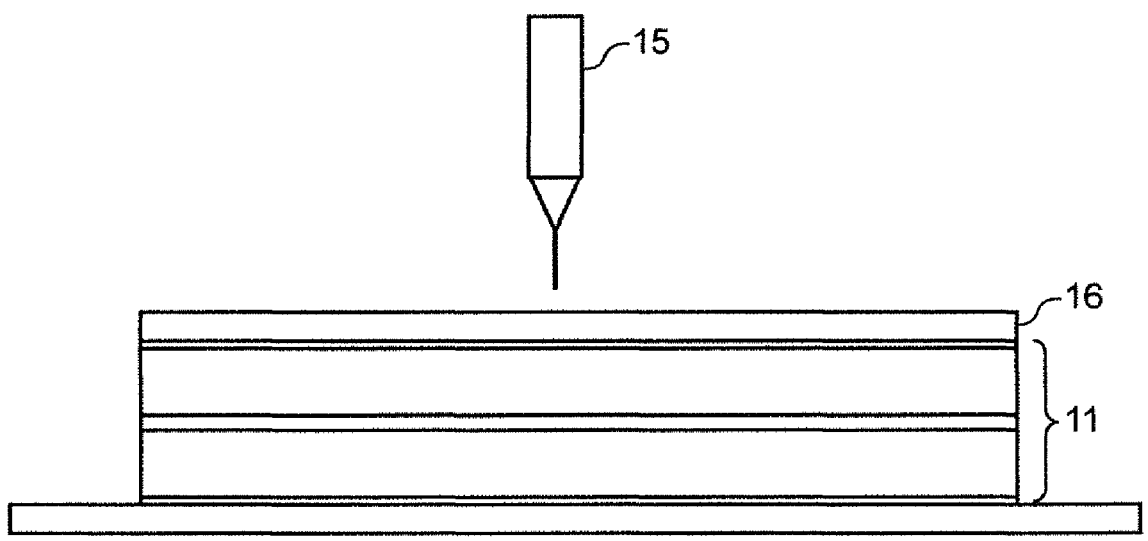
FIG. 4 is a schematic diagram for explaining drilling when measuring a drill wear rate in examples.

As shown in FIG. 4, 2 sheets of evaluation substrates (metal-clad laminates) 11 were stacked, and entry board 16 was placed thereon. On evaluation substrates (metal-clad laminates) 11 on which entry board 16 was placed, 3000 holes reaching from entry board 16 to evaluation substrates (metal-clad laminates) 11 were made using drill 15 under the following processing conditions. The size (area) of a drill blade after drilling was measured. The wear rate of the drill blade was calculated from the measured size (area) of the drill blade after drilling and the size (area) of the drill blade before drilling.

Entry board: Al 0.15 mm
Number of stacked sheets: 0.75 mm×2 sheets stacked
Hole: 0.3 mm diameter×5.5 mm depth
Bit P/No.: NHUL020, Rotation speed: 160 Krpm, Feed rate: 20μ/rev The results in the above evaluation are shown in Tables 1 and 2.

TABLE 1

| | | | Examples | | | | | | | | |
|---|---|---|---|---|---|---|---|---|---|---|---|
| | | | 1 | 2 | 3 | 4 | 5 | 6 | 7 | 8 | 9 |
| Resin composition (parts by mass) | PPE | Modified PPE-1 | 70 | 50 | 70 | 70 | 70 | 70 | 70 | — | 70 |
| | | Modified PPE-2 | — | — | — | — | — | — | — | 70 | — |
| | | Unmodified PPE | — | — | — | — | — | — | — | — | — |
| | Cross-linkable curing agent | TAIC | 30 | 50 | 30 | 30 | 30 | 30 | 30 | 30 | — |
| | | DCP | — | — | — | — | — | — | — | — | 30 |
| | | Epoxy resin | — | — | — | — | — | — | — | — | — |
| | Initiator | PBP | 0.5 | 0.5 | 0.5 | 0.5 | 1 | 0.5 | 0.5 | 0.5 | 0.5 |
| | Catalyst | 2E4MZ | | | | | | | | | |
| | Inorganic filler | Silica | 100 | 100 | 100 | 100 | 100 | 200 | 100 | 100 | 100 |
| | | Alumina | — | — | — | — | — | — | 100 | — | — |
| PPE Content [PPE/PPE + Crosslinkable curing agent] (% by mass) | | | 70 | 50 | 70 | 70 | 70 | 70 | 70 | 70 | 70 |
| Relative permittivity of cured product of resin composition | | | 2.6 | 2.6 | 2.6 | 2.6 | 2.6 | 2.9 | 3.6 | 2.6 | 2.6 |
| Fibrous base material | Q Glass cloth | | Present | Present | Present | Present | Present | Present | Present | Present | Present |
| | QL Glass cloth | | — | — | — | — | — | — | — | — | — |
| | L2 Glass cloth | | — | — | — | — | — | — | — | — | — |
| | L Glass cloth | | — | — | — | — | — | — | — | — | — |
| Resin content (% by mass) | | | 62 | 62 | 75 | 50 | 62 | 64 | 65 | 62 | 62 |
| Number of stacked sheets | | | 3 | 3 | 2 | 4 | 3 | 3 | 3 | 3 | 3 |
| Relative permittivity of cured product of prepreg | | | 2.9 | 2.9 | 2.8 | 3.0 | 2.9 | 3.1 | 3.7 | 2.9 | 2.9 |
| Dielectric loss tangent of cured product of prepreg | | | 0.0017 | 0.0016 | 0.0018 | 0.0016 | 0.002 | 0.0016 | 0.0017 | 0.0016 | 0.0019 |
| Skew | | | Good | Good | Very Good | Good | Good | Very Good | Very Good | Good | Good |

TABLE 1-continued

| | | | | | | | | | |
|---|---|---|---|---|---|---|---|---|---|
| Tg(° C.) | 225 | 210 | 225 | 225 | 240 | 225 | 225 | 210 | 220 |
| Transmission loss (dB/m) | −20 | −20 | −21 | −20 | −22 | −20 | −22 | −20 | −21 |

| | | | Examples | | Comparative Examples | | | | |
|---|---|---|---|---|---|---|---|---|---|
| | | | 10 | 11 | 1 | 2 | 3 | 4 | 5 |
| Resin composition (parts by mass) | PPE | Modified PPE-1 | 70 | 70 | 30 | 70 | 70 | 70 | — |
| | | Modified PPE-2 | — | — | — | — | — | — | — |
| | | Unmodified PPE | — | — | — | — | — | — | 70 |
| | Cross-linkable curing agent | TAIC | 30 | 30 | 70 | 30 | 30 | 30 | — |
| | | DCP | — | — | — | — | — | — | — |
| | | Epoxy resin | — | — | — | — | — | — | 30 |
| | Initiator | PBP | 0.5 | 0.5 | 0.5 | 0.5 | 2 | 0.5 | — |
| | Catalyst | 2E4MZ | — | — | — | — | — | — | 0.5 |
| | Inorganic filler | Silica | 100 | 100 | 100 | 100 | 100 | 100 | 100 |
| | | Alumina | — | — | — | — | — | 200 | — |
| PPE Content [PPE/PPE + Crosslinkable curing agent] (% by mass) | | | 70 | 70 | 30 | 70 | 70 | 70 | 70 |
| Relative permittivity of cured product of resin composition | | | 2.6 | 2.6 | 2.5 | 2.6 | 2.6 | 4.3 | 2.8 |
| Fibrous base material | Q Glass cloth | | — | — | Present | — | Present | Present | Present |
| | QL Glass cloth | | Present | — | — | — | — | — | — |
| | L2 Glass cloth | | — | Present | — | — | — | — | — |
| | L Glass cloth | | — | — | — | Present | — | — | — |
| Resin content (% by mass) | | | 62 | 62 | 62 | 62 | 62 | 66 | 62 |
| Number of stacked sheets | | | 3 | 3 | 3 | 3 | 3 | 3 | 3 |
| Relative permittivity of cured product of prepreg | | | 3.0 | 3.1 | 2.9 | 3.3 | 3.0 | 4.2 | 3.1 |
| Dielectric loss tangent of cured product of prepreg | | | 0.0019 | 0.0019 | 0.0016 | 0.0024 | 0.0026 | 0.0017 | 0.004 |
| Skew | | | Good | Good | Good | Poor | Good | Very Good | Good |
| Tg(° C.) | | | 225 | 225 | 190 | 225 | 225 | 225 | 190 |
| Transmission loss (dB/m) | | | −21 | −21 | −20 | −24 | −25 | −24 | −35 |

From Table 1, it was found that when a prepreg including a resin composition containing the modified polyphenylene ether compound and the crosslinkable curing agent in a predetermined ratio, in which the resin composition or a semi-cured product thereof had a relative permittivity of a cured product thereof of preferably 2.6 to 3.8, and a fibrous base material that was a glass cloth having a relative permittivity of 4.7 or less and a dielectric loss tangent of 0.0033 or less, in which a cured product of the prepreg had a relative permittivity of 2.7 to 3.8, and a dielectric loss tangent of 0.002 or less (Examples 1 to 11), the relative permittivity and the dielectric loss tangent were low as described above, and the loss in signal transmission was sufficiently suppressed, as compared with the other cases. Further, it was found that not only the loss in signal transmission can be sufficiently suppressed, but also the signal quality degradation due to skew can be sufficiently suppressed. Furthermore, it was found that the cured products of the prepregs according to Examples 1 to 11 had high heat resistance because of high Tg.

TABLE 2

| | | | Examples | | | | Comparative Examples | |
|---|---|---|---|---|---|---|---|---|
| | | | 1 | 11 | 12 | 13 | 2 | 6 |
| Resin composition (parts by mass) | PPE | Modified PPE-1 | 70 | 70 | 70 | 70 | 70 | 70 |
| | Crosslinkable curing agent | TAIC | 30 | 30 | 30 | 30 | 30 | 30 |
| | Initiator | PBP | 0.5 | 0.5 | 0.5 | 0.5 | 0.5 | 0.5 |
| | Inorganic filler | Zinc molybdate talc | — | — | 2 | 2 | — | 2 |
| | | Silica | 100 | 100 | 100 | 100 | 100 | 100 |
| PPE Content [PPE/PPE + Crosslinkable curing agent] (% by mass) | | | 70 | 70 | 70 | 70 | 70 | 70 |
| Relative permittivity of cured product of resin composition | | | 2.6 | 2.6 | 2.6 | 2.6 | 2.6 | 2.6 |
| Fibrous base material | Q Glass cloth | | Present | — | Present | — | — | — |
| | QL Glass cloth | | — | — | — | — | — | — |
| | L2 Glass cloth | | — | Present | — | Present | — | — |
| | L Glass cloth | | — | — | — | — | Present | Present |

TABLE 2-continued

|  | Examples | | | | Comparative Examples | |
| --- | --- | --- | --- | --- | --- | --- |
|  | 1 | 11 | 12 | 13 | 2 | 6 |
| Resin content (% by mass) | 62 | 62 | 62 | 62 | 62 | 62 |
| Number of stacked sheets | 3 | 3 | 3 | 3 | 3 | 3 |
| Relative permittivity of cured product of prepreg | 2.9 | 3.1 | 2.9 | 3.1 | 3.3 | 3.3 |
| Dielectric loss tangent of cured product of prepreg | 0.0017 | 0.0019 | 0.0017 | 0.0019 | 0.0024 | 0.0024 |
| Skew | Good | Good | Good | Good | Poor | Poor |
| Tg(° C.) | 225 | 225 | 225 | 225 | 225 | 225 |
| Drill wear rate (%) | 90 | 35 | 50 | 23 | 30 | 21 |
| Transmission loss (dB/m) | −20 | −21 | −20 | −21 | −24 | −24 |

As can be seen from Table 2, when talc in which zinc molybdate was present on at least a part of the surface was contained in the resin composition as an inorganic filler (Example 12, Example 13, and Comparative Example 6), drill wearability was lower than that in the case not contained (Example 1, Example 11, and Comparative Example 2). Further, even if talc in which zinc molybdate was present on at least a part of the surface was contained in the resin composition as an inorganic filler, it was found that when a prepreg including a resin composition containing the modified polyphenylene ether compound and the crosslinkable curing agent in a predetermined ratio, in which a cured product of the resin composition or a semi-cured product had a relative permittivity of preferably 2.6 to 3.8, and a fibrous base material that was a glass cloth having a relative permittivity of 4.7 or less and a dielectric loss tangent of 0.0033 or less, in which a cured product of the prepreg had a relative permittivity of 2.7 to 3.8, and a dielectric loss tangent of 0.002 or less (Examples 12 and 13), the relative permittivity and the dielectric loss tangent were low, and the loss in signal transmission was sufficiently suppressed. Therefore, it was found that when talc in which zinc molybdate was present on at least a part of the surface was contained as an inorganic filler, drilling workability can also be improved while sufficiently suppressing loss in signal transmission and signal quality degradation due to skew.

This application is based on Japanese Patent Application No. 2017-190781 filed on Sep. 29, 2017, the content of which is included in the present application.

In order to describe the present invention, the present invention has been properly and fully described in the preceding through embodiments. However, it should be recognized that these embodiments can be readily modified and/or improved by those skilled in the art. Accordingly, insofar as a modified form or improved form devised by those skilled in the art is not at a level that departs from the scope of rights described in the claims, such a modified form or improved form is construed to be encompassed by this scope of rights.

INDUSTRIAL APPLICABILITY

According to the present invention, a prepreg and a metal-clad laminate that can suitably produce a wiring board excellent in heat resistance, in which loss in signal transmission and signal quality degradation due to skew are sufficiently suppressed is provided. In addition, a wiring board excellent in heat resistance, in which loss in signal transmission and signal quality degradation due to skew are sufficiently suppressed is provided.

The invention claimed is:

1. A prepreg comprising a resin composition or a semi-cured product of the resin composition, and a glass cloth, wherein
    the resin composition contains a modified polyphenylene ether compound terminally modified with a substituent having an unsaturated carbon-carbon double bond, and a crosslinkable curing agent having an unsaturated carbon-carbon double bond in a molecule,
    a content of the modified polyphenylene ether compound is from 40% by mass to 90% by mass with respect to a total mass of the modified polyphenylene ether compound and the crosslinkable curing agent,
    air permeability of the glass cloth is 200 $cm^3/cm^2/sec$ or less,
    a cured product of the resin composition has a relative permittivity of 2.6 to 3.8,
    the glass cloth has a relative permittivity of 4.7 or less and a dielectric loss tangent of 0.0033 or less, and
    a cured product of the prepreg has a relative permittivity of 2.7 to 3.8 and a dielectric loss tangent of 0.002 or less.

2. The prepreg according to claim 1, wherein the glass cloth contains a glass cloth surface-treated with a silane coupling agent having an unsaturated carbon-carbon double bond in a molecule.

3. The prepreg according to claim 1, wherein the crosslinkable curing agent contains at least one selected from the group consisting of styrene, divinylbenzene, acrylate compounds, methacrylate compounds, trialkenyl isocyanurate compounds, polybutadiene compounds, and maleimide compounds.

4. The prepreg according to claim 2, wherein the silane coupling agent contains a silane coupling agent having in the molecule at least one functional group selected from the group consisting of a vinyl group, a styryl group, a methacrylic group, and an acrylic group.

5. The prepreg according to claim 1, wherein the substituent in the modified polyphenylene ether compound contains at least one selected from the group consisting of a vinylbenzyl group, a vinyl group, an acrylate group, and a methacrylate group.

6. A metal-clad laminate comprising an insulating layer containing a cured product of the prepreg according to claim 1, and a metal foil.

7. A wiring board comprising an insulating layer containing a cured product of the prepreg according to claim 1, and wiring.

\* \* \* \* \*